(12) United States Patent
Hoeppel et al.

(10) Patent No.: US 8,841,685 B2
(45) Date of Patent: Sep. 23, 2014

(54) OPTOELECTRONIC SEMICONDUCTOR CHIP

(75) Inventors: Lutz Hoeppel, Alteglofsheim (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 351 days.

(21) Appl. No.: 13/056,589

(22) PCT Filed: Jun. 29, 2009

(86) PCT No.: PCT/DE2009/000917
§ 371 (c)(1),
(2), (4) Date: Apr. 22, 2011

(87) PCT Pub. No.: WO2010/012256
PCT Pub. Date: Feb. 4, 2010

(65) Prior Publication Data
US 2011/0284893 A1 Nov. 24, 2011

(30) Foreign Application Priority Data
Jul. 28, 2008 (DE) .......................... 10 2008 035 110

(51) Int. Cl.
*H01L 33/00* (2010.01)
*H01L 33/38* (2010.01)
*H01L 33/42* (2010.01)
*H01L 33/40* (2010.01)

(52) U.S. Cl.
CPC .............. *H01L 33/387* (2013.01); *H01L 33/405* (2013.01); *H01L 33/42* (2013.01)
USPC .................................... 257/98; 257/E33.068

(58) Field of Classification Search
USPC ............................................ 257/98, E33.068
See application file for complete search history.

(56) References Cited

U.S. PATENT DOCUMENTS

| 7,057,212 B2 | 6/2006 | Kim et al. |
| 2002/0130327 A1 | 9/2002 | Wu et al. |
| 2002/0195606 A1 | 12/2002 | Edmond et al. |
| 2003/0010994 A1* | 1/2003 | Chen et al. ........................ 257/99 |
| 2003/0111667 A1 | 6/2003 | Schubert |

(Continued)

FOREIGN PATENT DOCUMENTS

| DE | 100 17 758 | 12/2000 |
| DE | 101 47 886 | 4/2003 |

(Continued)

OTHER PUBLICATIONS

J. K. Kim et al., "GaInN light-emitting diodes with $RuO_2/SiO_2/Ag$ omni-directional reflector", Applied Physics Letters, vol. 84, No. 22, pp. 4508-4510, May 31, 2004.

(Continued)

*Primary Examiner* — Dale E Page
(74) *Attorney, Agent, or Firm* — Cozen O'Connor

(57) ABSTRACT

A description is given of an optoelectronic semiconductor chip (1) comprising a semiconductor layer sequence (2), which has an active zone (4) for generating electromagnetic radiation, and comprising a structured current spreading layer (6), which contains a transparent conductive oxide and is arranged on a main area (12) of the semiconductor layer sequence (2), wherein the current spreading layer (6) covers at least 30% and at most 60% of the main area (12).

14 Claims, 5 Drawing Sheets

(56) References Cited

U.S. PATENT DOCUMENTS

| | | |
|---|---|---|
| 2003/0141506 A1 | 7/2003 | Sano et al. |
| 2004/0262620 A1 | 12/2004 | Albrecht et al. |
| 2005/0035364 A1 | 2/2005 | Sano et al. |
| 2005/0087884 A1* | 4/2005 | Stokes et al. ............... 257/778 |
| 2005/0093002 A1 | 5/2005 | Tsai et al. |
| 2005/0253163 A1 | 11/2005 | Eberhard et al. |
| 2007/0194325 A1 | 8/2007 | Sung et al. |
| 2007/0278508 A1 | 12/2007 | Baur et al. |
| 2008/0142824 A1 | 6/2008 | Chen et al. |
| 2008/0315220 A1 | 12/2008 | Lee et al. |
| 2010/0019268 A1 | 1/2010 | Illek |

FOREIGN PATENT DOCUMENTS

| | | |
|---|---|---|
| DE | 10 2004 029 216 | 8/2005 |
| DE | 10 2006 034 847 | 10/2007 |
| DE | 10 2008 035 900 | 11/2009 |
| JP | 11 168239 | 6/1999 |
| JP | 2005 123501 | 5/2005 |
| JP | 2005-513787 | 5/2005 |
| JP | 2006-310893 | 11/2006 |
| JP | 2007 207869 | 8/2007 |
| JP | 2007-281037 | 10/2007 |
| TW | 471185 | 1/2002 |
| TW | 200828642 | 7/2008 |
| WO | WO 03/052838 | 6/2003 |
| WO | WO 2009/132641 | 11/2009 |

OTHER PUBLICATIONS

J.K. Kim et al., "Enhanced light-extraction in GaInN near-ultraviolet light-emitting diode with Al-based omnidirectioal reflector having NiZn/AG microcontacts", Applied Physics Letters, vol. 89, No. 141123, 2006.

* cited by examiner

OPTOELECTRONIC SEMICONDUCTOR CHIP

RELATED APPLICATIONS

This is a U.S. national stage of application No. PCT/DE2009/000917, filed on Jun. 29, 2009.

This application claims the priority of German application no. 10 2008 035 110.5 filed Jul. 28, 2008, the entire content of which is hereby incorporated by reference.

FIELD OF THE INVENTION

The present invention is related to an optoelectronic semiconductor chip having an improved luminous efficiency.

The luminous efficiency of radiation-emitting semiconductor chips is dependent on various factors. On the one hand, a relatively high internal quantum efficiency can be obtained by means of a large-area electrical contact-connection of the semiconductor chip. On the other hand, however, absorption losses can occur as a result of a large-area contact-connection, said absorption losses considerably restricting the coupling-out efficiency and hence the luminous efficiency of the semiconductor chip.

DE patent application No. 102008021675.5 describes the fact that the contacts provided for the electrical contact-connection of the light-emitting diode chip should not cover more than 2%-4% of a current spreading layer.

SUMMARY OF THE INVENTION

One object of the present invention is to provide an optoelectronic semiconductor chip having an improved luminous efficiency.

In accordance with one preferred embodiment, the optoelectronic semiconductor chip comprises a semiconductor layer sequence, which comprises an active zone for generating electromagnetic radiation, and also a structured current spreading layer, which contains a transparent conductive oxide and is arranged on a main area of the semiconductor layer sequence, wherein the current spreading layer covers at least 30% and at most 60% of the main area.

The active zone comprises a pn junction for the purpose of generating radiation. In the simplest case, said pn junction can be formed by means of a p-conducting semiconductor layer and an n-conducting semiconductor layer, which directly adjoin one another. Preferably, the actual radiation-generating structure, for instance in the form of a doped or undoped quantum structure, is formed between the p-conducting layer and the n-conducting layer. The quantum structure can be embodied as a single quantum well (SQW) structure or multiple quantum well (MQW) structure or else as a quantum wire or quantum dot structure.

In one advantageous configuration of the semiconductor chip, the semiconductor layer sequence contains $Al_nGa_mIn_{1-n-m}N$ where $0 \leq n \leq 1$, $0 \leq m \leq 1$, and $n+m \leq 1$. A semiconductor chip based on nitride compound semiconductors is suitable, in particular, for generating radiation having an emission wavelength in the short-wave range of the visible spectrum.

The transparent conductive oxide is preferably a metal oxide such as, for example, zinc oxide, tin oxide, cadmium oxide, titanium oxide, indium zinc oxide, indium oxide or indium tin oxide (ITO). Alongside binary metal-oxygen compounds such as, for example, $ZnO$, $SnO_2$, or $In_2O_3$ it is also possible to use ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Furthermore, no stoichiometric composition is required. Furthermore, the transparent conductive oxide can also be p- or n-doped.

The current spreading layer makes it possible to obtain sufficiently good current spreading and energization of the semiconductor chip.

Furthermore, by means of the partial area coverage, optical absorption losses caused by the current spreading layer can be reduced by comparison with a whole-area current spreading layer.

In accordance with a further preferred embodiment, the current spreading layer covers 40% to 50% of the main area. Firstly, the absorption losses are advantageously reduced in the case of such an area coverage; secondly, sufficiently good current spreading in the current spreading layer can be ensured in the case of such an area coverage.

A smaller area coverage is advantageous, in particular, if the generated radiation has an emission wavelength of between 400 nm and 450 nm. For in the shorter-wave range of the visible spectrum the optical absorption caused by the current spreading layer constitutes a greater loss mechanism than the electrical losses on account of the smaller area coverage. In the longer-wave range of the visible spectrum, by contrast, the losses caused by the optical absorption are lower, such that the electrical losses are of greater consequence in the case of a smaller area coverage. Therefore, a larger area coverage is better suited in this case.

The thickness of the current spreading layer can advantageously be between 10 nm and 60 nm. While the optical absorption losses can be reduced by reducing the thickness, in this case the transverse conductivity decreases at the same time. With a thickness of between 10 nm and 60 nm, gain and loss are in a suitable ratio to one another.

Furthermore, the size, that is to say the length and/or width of interspaces of the structured current spreading layer, that is to say of regions which are not covered by the current spreading layer, is advantageously adapted to the transverse conductivity of the semiconductor material of the semiconductor layer sequence that adjoins the current spreading layer. In particular, it is possible to ensure transverse conduction by means of the adjoining semiconductor layer sequence over a distance of 1 μm to 6 μm without a current spreading layer being required. The interspaces therefore advantageously have a size of between 1 μm and 6 μm. Preferably, the interspaces are formed with a size in the range of between 3 μm and 4 μm. Taking account of this relationship, the current spreading layer can be structured in various ways. By way of example, irregular structures or regular structures such as grids are conceivable.

In accordance with one advantageous configuration, the structure of the current spreading layer corresponds to a rectangular grid. The grid comprises, in particular, a plurality of parallel strips composed of transparent conductive oxide which extend in a first direction, and a plurality of parallel strips composed of transparent conductive oxide which extend in a second direction, wherein the first direction runs perpendicular to the second direction. The distance between the parallel strips extending in the first direction can differ from the distance between the parallel strips extending in the second direction. The crossing points of the strips correspond to grid points.

Electrical contact is made with the current spreading layer preferably by means of at least one electrical contact web. Said contact web extends, in particular, perpendicularly to a plane in which the current spreading layer is arranged, and touches the current spreading layer at a contact location provided therefor. The contact web can have the form of a truncated cone, truncated pyramid or cylinder.

In particular, a plurality of contact webs are distributed regularly over the area of the current spreading layer. The respective contact location is preferably situated at a grid point. In this case, however, a contact location need not be provided at every grid point.

Preferably, the contact web contains a metal having a high conductivity. Furthermore, a material having a high reflectance is preferably used for the contact web. One suitable material is Ag, for example.

In accordance with one preferred embodiment, the current spreading layer is arranged between the semiconductor layer sequence and a mirror.

In particular, the electrical contact web runs in an opening of the mirror. If the contact web has a high reflectance, as already mentioned, then overall a high reflectivity can be obtained by means of the combination of mirror and contact web. As a result, the radiation emitted by the active zone in the direction of the current spreading layer can be reflected without great optical losses in the direction of a coupling-out area. The coupling-out area is arranged, in particular, on a side of the active zone which lies opposite the current spreading layer. In addition, the optical losses are limited by virtue of the structured current spreading layer and the reduced area coverage associated therewith.

In one advantageous configuration, the mirror comprises a dielectric layer. In particular, the dielectric layer has a lower refractive index than the semiconductor material of the semiconductor layer sequence. By way of example, the dielectric layer is formed from a silicon oxide, a silicon nitride or glass, preferably a spin-on glass. The dielectric layer can also be embodied as a Bragg mirror, in which dielectric partial layers having different refractive indices are arranged alternately.

The mirror, in particular the dielectric layer, preferably adjoins the current spreading layer. The interspaces of the structured current spreading layer can be filled at least by a part of the mirror, in particular the dielectric layer. Furthermore, at least one part of the mirror or the dielectric layer can cover the current spreading layer. Preferably, the opening in which the contact web extends is provided in the dielectric layer.

Furthermore, the mirror advantageously comprises a continuous metal layer. The latter is arranged, in particular, on a side of the mirror which is remote from the current spreading layer. Preferably, the dielectric layer is covered by the metal layer. The metal layer can be embodied at least in two-layered fashion. By way of example, the metal layer can comprise a layer composed of platinum and/or titanium for adhesion promotion and a layer having a high reflectance, for example composed of silver.

In accordance with one preferred embodiment, the semiconductor chip is a thin-film light-emitting diode chip. In this case, the semiconductor layer sequence is free of a growth substrate, that is to say that the growth substrate used for the growth of the semiconductor layer sequence is removed from the semiconductor layer sequence or at least greatly thinned.

For the stabilization of the semiconductor layer sequence, the latter can alternatively be arranged on a carrier substrate. In particular, the carrier substrate is situated on a rear side of the semiconductor chip lying opposite the coupling-out side. The current spreading layer is preferably arranged between the semiconductor layer sequence and the carrier substrate.

In accordance with one advantageous embodiment, the carrier substrate is electrically conductive and serves as a first electrical contact for the semiconductor chip. In this case, the current spreading layer is advantageously electrically connected to the carrier substrate by means of the electrical contact web, if appropriate via the metal layer of the mirror. A second electrical contact can be arranged on the coupling-out area.

In one preferred configuration, the semiconductor layer sequence is p-conducting on the side of the current spreading layer. Since the p-side typically has a poor conductivity, a current spreading layer having a high electrical conductivity is advantageous. Suitable dopant concentrations are in the range from $10^{20}/cm^3$.

DETAILED DESCRIPTION OF THE DRAWINGS

In the exemplary embodiments and figures, identical or identically acting constituent parts are provided with the same reference symbols.

Figure 1:
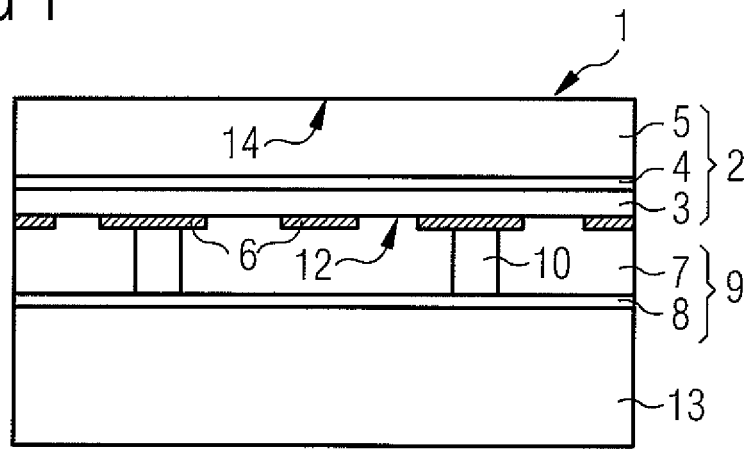
FIG. 1 shows a schematic cross-sectional view of an optoelectronic semiconductor chip.

FIG. 1 shows an optoelectronic semiconductor chip 1, comprising a semiconductor layer sequence 2, having an active zone 4 for generating electromagnetic radiation. The active zone 4 is situated between a first semiconductor region 3 and a second semiconductor region 5. In this exemplary embodiment, the first semiconductor region 3 is p-conducting and the second semiconductor region 5 is n-conducting. Preferably, the two semiconductor regions 3, 5 contain GaN and the active zone 4 contains InGaN. The two semiconductor regions 3, 5 and the active zone 4 can each comprise a plurality of semiconductor layers.

Preferably, the semiconductor layer sequence 2 is grown epitaxially, wherein the growth substrate (not illustrated) is stripped from the semiconductor layer sequence 2, such that the semiconductor layer sequence 2 has a thickness of less than 10 μm.

For stabilization purposes, the semiconductor layer sequence 2 is alternatively arranged on a carrier substrate 13. The carrier substrate 13 is preferably electrically conductive.

Suitable substrates are Ge or Si substrates, for example. Alternatively, the carrier substrate 13 can be produced from Cu by means of electrolytic reinforcement of a preceding metal layer.

A structured current spreading layer 6 is arranged on a main area 12 of the semiconductor layer sequence 2. The current spreading layer 6, which contains a transparent conductive oxide, can be uniformly vapor-deposited or sputtered onto the main area 12 and subsequently structured in a suitable manner. The structuring can be effected lithographically, for example. The thickness of the current spreading layer 6 is advantageously between 10 nm and 60 nm. By reducing the thickness it is possible, on the one hand, for the optical absorption losses to be reduced, as a result of which, on the other hand, the transverse conductivity decreases. With a thickness of between 10 nm and 60 nm there is a good compromise between optical and electrical losses.

A mirror 9 is arranged on the main area 12, such that the radiation emitted in the direction of the main area 12 can be deflected in the direction of the coupling-out area 14.

In this exemplary embodiment, the mirror 9 comprises a dielectric layer 7, which is formed, in particular, from a material having a relatively low refractive index, for example from a spin-on glass having a refractive index of less than 1.4. The dielectric layer 7 can have a thickness in the range of 400 nm to 500 nm. Furthermore, the mirror 9 comprises a metal layer 8 adjoining the dielectric layer 7. The metal layer 8 can be formed from an adhesion promotion layer composed of Pt and a reflection layer composed of Ag. The thickness of the metal layer 8 can be so thin that it has interruptions. A layer thickness of approximately 0.2 nm is sufficient.

The structured current spreading layer 6 is embedded into the dielectric layer 7.

Furthermore, the dielectric layer 7 comprises openings in which contact webs 10 extend. The contact webs 10 run perpendicularly to a plane in which the current spreading layer 6 is arranged, and touch the latter at contact locations provided therefor. The contact webs 10 advantageously contain an electrically conductive material, such that the current spreading layer 6 can be energized by means of the contact webs 10. By way of example, the contact webs 10 can contain Ag, which additionally has a relatively high reflectance, such that the reflectivity of the mirror 9 is not significantly reduced at the contact webs 10. In this context it is additionally advantageous if the area coverage of the main area 12 by the contact webs 10 is not greater than 4%. In order nevertheless to ensure a sufficient current supply, the area coverage should not be less than 2%. The form of the contact webs 10 is preferably like a cylinder.

The contact webs 10 can produce an electrical connection between the current spreading layer 6 and the, in particular, electrically conductive carrier substrate 13.

Figure 2:
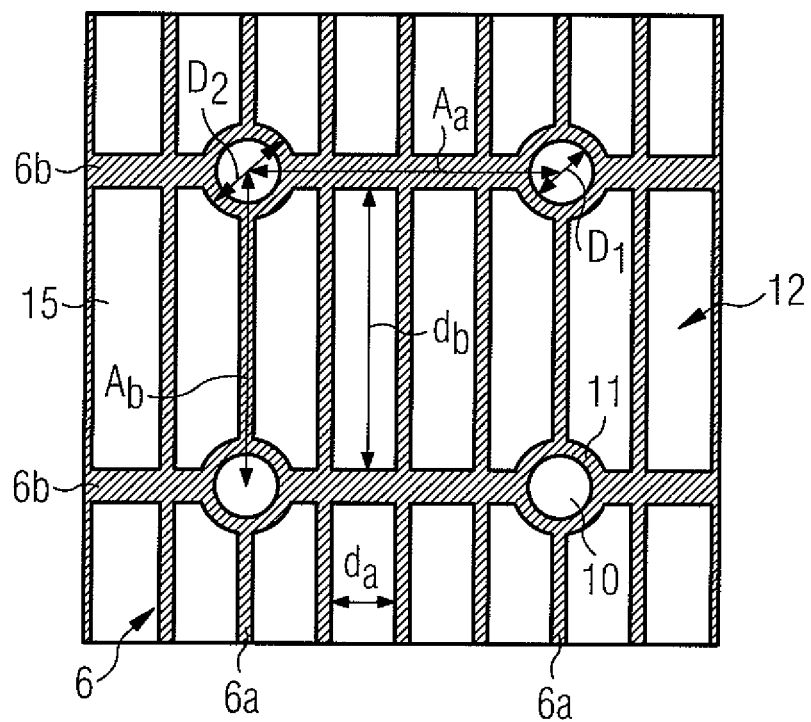
FIG. 2 shows a schematic view of a cross section along the current spreading layer of the semiconductor chip illustrated in FIG. 1, FIGS. 3A to 3D show the current density distribution over the main area with different area coverage.

FIG. 2 shows the main area 12 on which the structured current spreading layer 6 is applied. The current spreading layer 6 has the form of a rectangular grid formed from parallel strips 6a extending in a first direction and from parallel strips 6b extending in a second direction. Contact locations 11 are provided at a plurality of grid points, that is to say at a plurality of crossing points of the strips 6a and 6b, at which contact locations the contact webs 10 are arranged.

The contact locations 11 are produced from the same material as the strips 6a and 6b. They are circular in the same way as the cross sections of the contact webs 10 and are arranged concentrically with respect thereto.

Given an area coverage of 50% and a chip edge length of 1 mm, the contact locations 11 advantageously have a diameter $D_2$ of approximately 6 µm. The distances $A_b$ between the contact locations 11 in the first direction and the distances $A_a$ between the contact locations 11 in the second direction are preferably of the same magnitude and are approximately 20 µm. The diameter $D_1$ of the contact webs 10 is 4 µm.

The strips 6a are thinner than the strips 6b and can be approximately 2 µm wide, while the strips 6b are approximately 4 µm wide. Moreover, the strips 6a are arranged more densely than the strips 6b, that is to say the grid constants differ from one another in the first and second directions.

The rectangular interspaces 15, delimited by the strips 6a and 6b, have a length $d_b$ of approximately 16 µm and a width $d_a$ of approximately 3 µm.

FIGS. 3A to 3D show the current density distribution over the main area of a semiconductor chip as illustrated in FIG. 1 for different area coverages. The thickness of the current spreading layer 6 is 40 nm for all variants. The energization takes place with a nominal current density of 50 A/cm² in all variants.

Figure 3A:
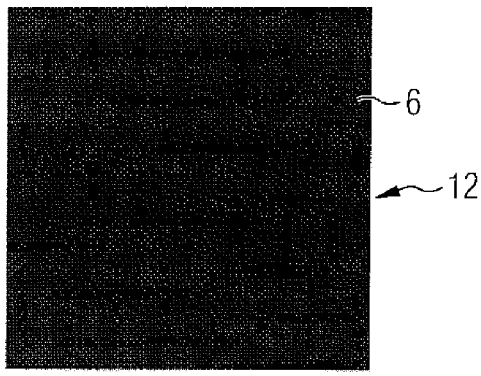
Figure 3B:
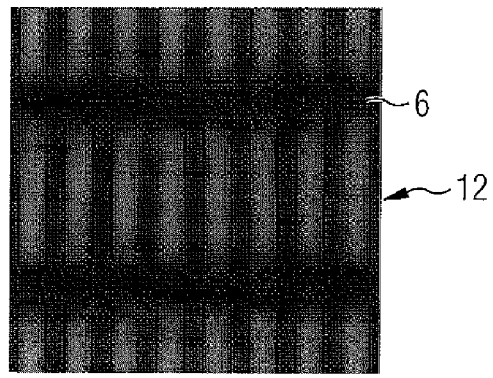
Figure 3C:
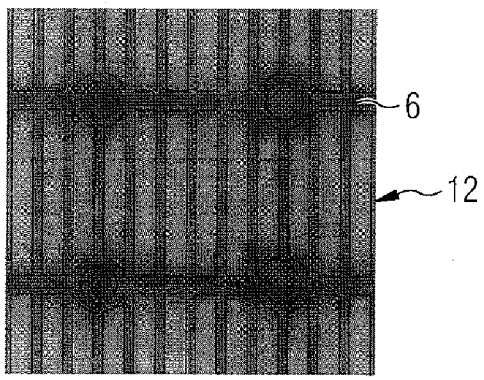
Figure 3D:
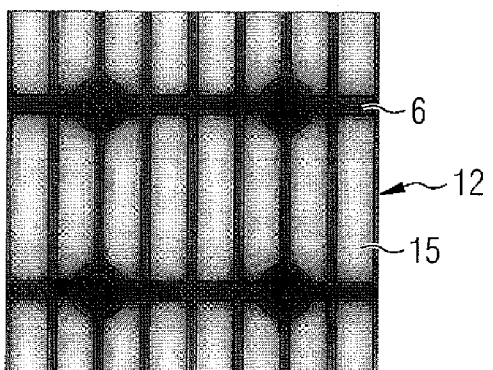

The area coverage is 100% in the variant illustrated in FIG. 3A, 50% in the variant illustrated in FIG. 3B, 40% in the variant illustrated in FIGS. 30 and 30% in the variant illustrated in FIG. 3D. The distances $A_b$ and $A_a$ (illustrated in FIG. 2), are kept constant in the different variants in FIGS. 3B to 3D. However, the strip width is reduced. Furthermore, the interspaces 15 can be enlarged. By way of example the width $d_a$ (illustrated in FIG. 2) of the interspaces 15 can be approximately 4 µm in the variant illustrated in FIG. 3D, while it is 3 µm in the variant illustrated in FIG. 3B.

Different current densities are represented by different gray levels, the current density in darker regions being higher than that in lighter regions.

As can be seen in FIG. 3A, in the case of 100% area coverage, ideally no inhomogeneities of the current density occur. In the case of 50% and 40% area coverage however, the current density decreases in the interspaces 15. This can lead to a gradient of up to 20%. Nevertheless, this can still be called relatively homogeneous current density distribution. The 30% area coverage is more critical, in the case of which a gradient of 40% and hence an inhomogeneous current density distribution can occur.

Figure 4:
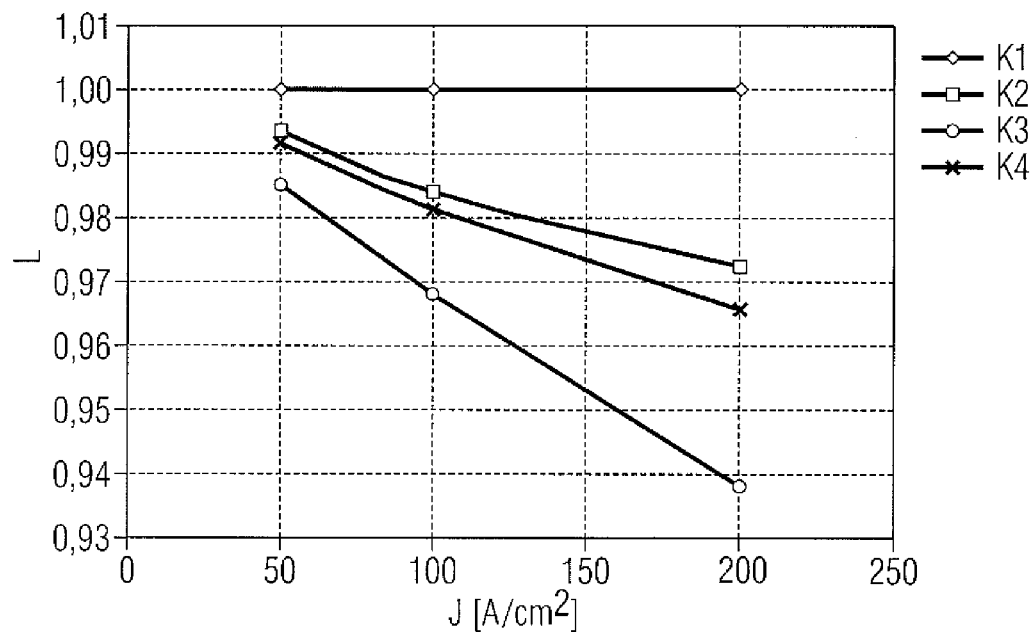
FIG. 4 shows a graph illustrating the electrical losses at different current densities.

The graph in FIG. 4 reveals the electrical losses 1-L that occur in the current spreading layer.

In the case of 100% area coverage, ideally no electrical losses occur (cf. K1). With decreasing area coverage (K2: 50%, K4: 40%, K3: 30%) however, the electrical losses 1-L increase. Electrical losses arise as a result of the smaller contact area and the poorer current spreading. In addition, losses occur as a result of the inhomogeneity of the current flow in the active zone, which are caused by the poorer current spreading in the first p-conducting semiconductor region. The losses 1-L increase as the current density J increases and as the area coverage decreases. The electrical losses 1-L are substantially independent of the wavelength.

Figure 5:
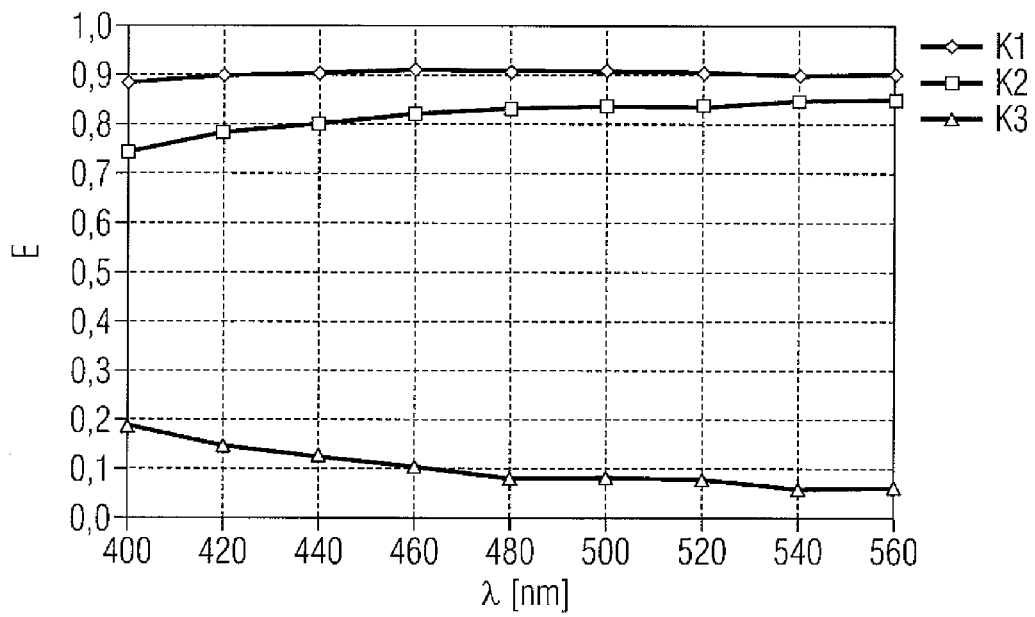
FIG. 5 shows a graph illustrating the extraction efficiency for different wavelengths.

FIG. 5 shows, for different emission wavelengths λ, the extraction efficiency E of a semiconductor chip with a mirror comprising a 500 nm thick $SiO_2$ layer and a 0.2 nm thick Pt/Ag layer, for the case where no current spreading layer is used (K1) and for the case where a current spreading layer with 100% area coverage is used (K2). The current spreading layer has a thickness of 30 nm.

K3 represents the absorption losses which are caused by the current spreading layer. This reveals that the absorption of the current spreading layer is greatly wavelength-dependent. Losses of approximately 20% occur in the shorter-wave range as a result of the current spreading layer, where they are approximately 5% in the longer-wave range.

Figure 6:
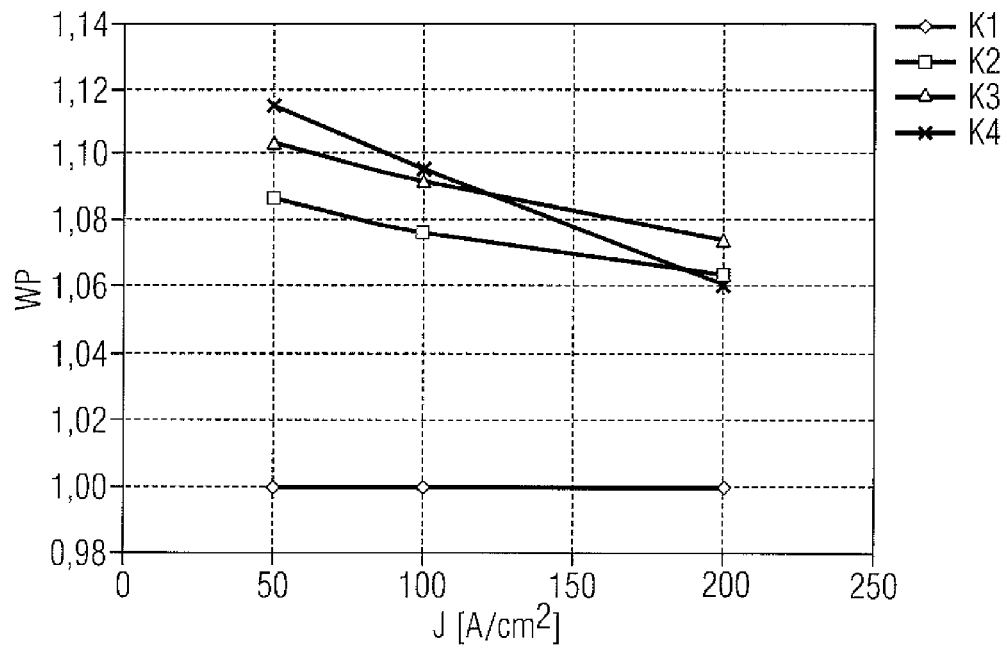
FIGS. 6 to 8 show graphs illustrating the wall-plug efficiencies as a function of different current densities for different wavelengths.
Figure 7:
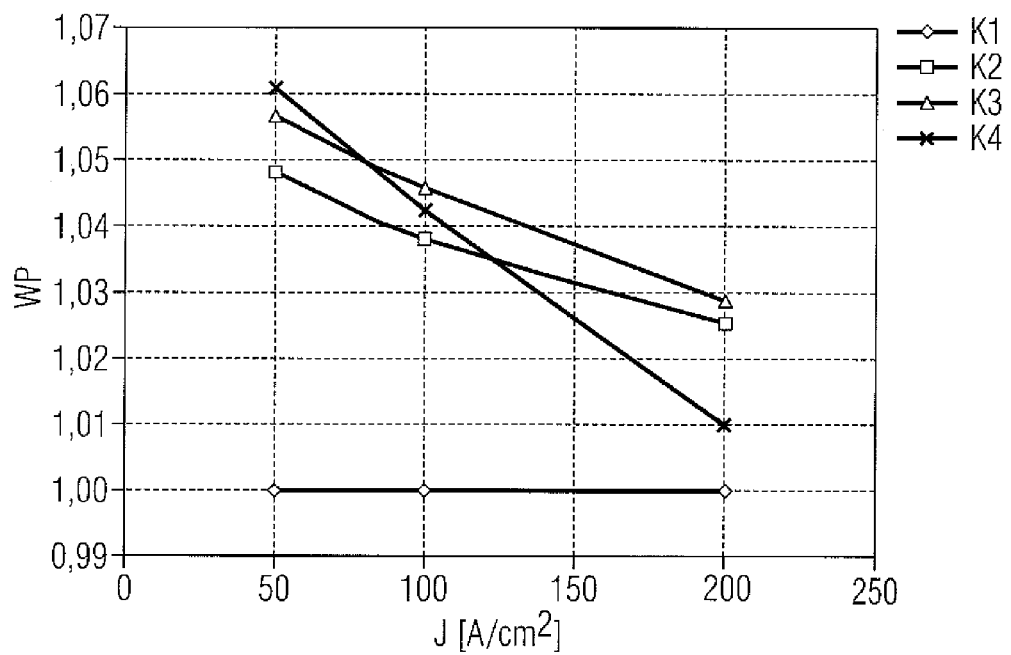
Figure 8:
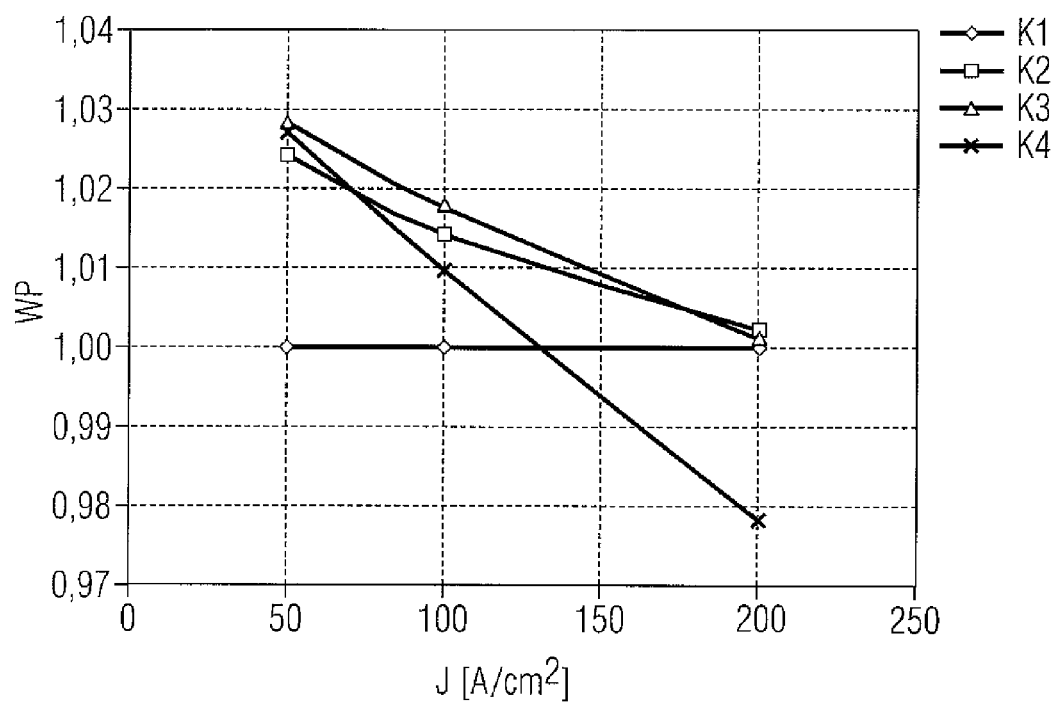

FIGS. 6 to 8 show the wall-plug efficiency WP, that is to say the electrical-to-optical efficiency, at emission wavelengths of 400 nm (FIG. 6), 460 nm (FIG. 7) and 540 nm (FIG. 8). In this case, the electrical losses are added to the expected gain in extraction efficiency.

The wall-plug efficiencies WP are specified at each wavelength for different current densities J and different area coverages of 100% (K1), 50% (K2), 40% (K3) and 30% (K4).

As is evident from FIG. 6 an improvement of up to approximately 10% arises for a semiconductor chip having an emission wavelength of 400 nm as a result of the structuring of the current spreading layer.

In the longer-wave range, the gain in extraction efficiency in the case of a structuring of the current spreading layer is not as great (approximately 6%) as in the shorter-wave range, because the transparency of the current spreading layer is higher and, consequently, electrical losses are of greater consequence. Up to a current density of 200 A/cm$^2$, however, an area coverage of 40% to 50% is better than an area coverage of 100%.

To summarize, therefore, it can be stated that, in particular, 40% to 50% area coverage of the main area by the current spreading layer brings about an increase in the luminous efficiency at all wavelengths from the shorter-wave to the longer-wave range of the visible spectrum.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
   a semiconductor layer sequence, which comprises an active zone for generating electromagnetic radiation;
   a structured current spreading layer, which contains a transparent conductive oxide and is arranged on a main area of the semiconductor layer sequence, wherein the current spreading layer covers at least 30% and at most 60% of the main area and comprises interspaces, at which the main area is not covered by the current spreading layer;
   a mirror comprising a dielectric layer, the current spreading layer being arranged between the semiconductor layer sequence and the mirror, wherein the interspaces of the current spreading layer are filled by the dielectric layer of the mirror; and
   at least one electrical contact web, the current spreading layer being connected to the electrical contact web at one contact location, wherein the electrical contact web extends in an opening of the dielectric layer of the mirror.

2. The optoelectronic semiconductor chip according to claim 1, wherein the current spreading layer covers 40% to 50% of the main area.

3. The optoelectronic semiconductor chip according to claim 1, wherein the generated radiation has an emission wavelength of between 400 nm and 450 nm.

4. The optoelectronic semiconductor chip according to claim 1, wherein the semiconductor layer sequence contains $Al_nGa_mIn_{1-n-m}N$, where $0 \leq n \leq 1$, $0 \leq m \leq 1$, and $n+m \leq 1$.

5. The optoelectronic semiconductor chip according to claim 1, wherein the current spreading layer contains indium tin oxide, indium zinc oxide or zinc oxide.

6. The optoelectronic semiconductor chip according to claim 1, wherein the current spreading layer has a thickness of between 10 nm and 60 nm.

7. The optoelectronic semiconductor chip according to claim 1, wherein the current spreading layer has the form of a rectangular grid.

8. The optoelectronic semiconductor chip according to claim 1, wherein the mirror comprises a continuous metal layer which covers the dielectric layer on a side of the dielectric layer remote from the current spreading layer.

9. The optoelectronic semiconductor chip according to claim 1, further comprising a carrier substrate, wherein the current spreading layer is arranged between the semiconductor layer sequence and the carrier substrate.

10. The optoelectronic semiconductor chip according to claim 1 further comprising a carrier substrate, wherein the current spreading layer is arranged between the semiconductor layer sequence and the carrier substrate, wherein the current spreading layer is electrically connected to the carrier substrate by the electrical contact web.

11. The optoelectronic semiconductor chip according to claim 1, wherein the semiconductor layer sequence is p-conducting on the side of the current spreading layer.

12. The optoelectronic semiconductor chip according to claim 1, wherein the current spreading layer is connected to a metal contact web, at at least one contact location.

13. The optoelectronic semiconductor chip according to claim 1, wherein the current spreading layer is connected to an electrical contact web at at least one grid point.

14. The optoelectronic semiconductor chip according to claim 1, wherein at least 2% and not more than 4% of the main area is covered by the at least one electrical contact web.

* * * * *